United States Patent
Harris et al.

(10) Patent No.: US 9,466,743 B2
(45) Date of Patent: Oct. 11, 2016

(54) COPPER-INDIUM-GALLIUM-CHALCOGENIDE NANOPARTICLE PRECURSORS FOR THIN-FILM SOLAR CELLS

(71) Applicant: Nanoco Technologies, Ltd., Manchester (GB)

(72) Inventors: James Harris, Manchester (GB); Christopher Newman, West Yorkshire (GB); Ombretta Masala, Manchester (GB); Laura Wylde, Manchester (GB); Nigel Pickett, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 148 days.

(21) Appl. No.: 14/195,651

(22) Filed: Mar. 3, 2014

(65) Prior Publication Data

US 2014/0249324 A1    Sep. 4, 2014

Related U.S. Application Data

(60) Provisional application No. 61/772,372, filed on Mar. 4, 2013.

(51) Int. Cl.

| | |
|---|---|
| *H01L 31/032* | (2006.01) |
| *B82Y 30/00* | (2011.01) |
| *C01G 15/00* | (2006.01) |
| *C09D 11/037* | (2014.01) |
| *C09D 11/52* | (2014.01) |
| *C30B 29/46* | (2006.01) |
| *H01L 21/02* | (2006.01) |
| *C30B 7/14* | (2006.01) |
| *C30B 29/60* | (2006.01) |

(52) U.S. Cl.
CPC ........... *H01L 31/0322* (2013.01); *B82Y 30/00* (2013.01); *C01G 15/006* (2013.01); *C09D 11/037* (2013.01); *C09D 11/52* (2013.01); *C30B 7/14* (2013.01); *C30B 29/46* (2013.01); *C30B 29/60* (2013.01); *H01L 21/02568* (2013.01); *H01L 21/02601* (2013.01); *H01L 21/02628* (2013.01); *C01P 2002/72* (2013.01); *C01P 2002/84* (2013.01); *C01P 2002/88* (2013.01); *C01P 2004/04* (2013.01); *C01P 2004/64* (2013.01)

(58) Field of Classification Search
CPC .................. H01L 31/0322; H01L 21/02568; H01L 21/02601; H01L 21/02628; C03B 29/60; C03B 29/46; C03B 7/14; C09D 11/52; C09D 11/037; C01G 15/006
USPC ......................................................... 556/28
See application file for complete search history.

(56) References Cited

U.S. PATENT DOCUMENTS

| 7,892,519 B2 | 2/2011 | Pak et al. |
| 2011/0039104 A1 | 2/2011 | Zhong et al. |
| 2012/0192930 A1 | 8/2012 | Fox et al. |

FOREIGN PATENT DOCUMENTS

| JP | 2010-129658 A | 6/2010 |
| WO | 2007118118 A2 | 10/2007 |

OTHER PUBLICATIONS

Sun, Chivin et al., A Large-Scale Synthesis and Characterization of Quaternary CuInxGa1-xS2 Chalcopyrite Nanoparticles via Microwave Batch Reactions, International Journal of Chemical Engineering, vo. 2011, Article ID 545234, 8 pages, Hindawi Publishing Corporation.
H. Nakamura et al., Tunable Photoluminescence Wavelength of Chalcopyrite CuInS2-Based Semiconductor Nanocrystals Synthesized in a Colloidal System Chem. Mater., 2006, 18, 3330.
S.L. Castro et al., Nanocrystalline Chalcopyrite Materials (CuInS2 and CuInSe2) via Low-Temperature Pyrolysis of Molecular Single-Source PrecursorsChem. Mater., 2003, 15, 3142.
D.P. Dutta and G. Sharma, A facile route to the synthesis of CuInS2 nanoparticles Mater. Lett., 2006, 60, 2395.
S-H. Choi et al., One-Pot Synthesis of Copper—Indium Sulfide Nanocrystal Heterostructures with Acorn, Bottle, and Larva Shapes J. Am. Chem. Soc., 2006, 128, 2520.
C.J. Carmalt et al., Solid-state and solution phase metathetical synthesis of copper indium chalcogenides J. Mater. Chem., 1998, 8, 2209.
X. Guo et al., Shape-Controlled Synthesis of Ternary Chalcogenide ZnIn2S4 and CuIn(S,Se)2 Nano-/Microstructures via Facile Solution Route J. Am. Chem. Soc., 2006, 128, 7222.
Q. Lu et al., Synthesis of Nanocrystalline CuMS2 (M=In or Ga) through a Solvothermal Process Inorg. Chem., 2000, 39, 1606.

(Continued)

*Primary Examiner* — Porfirio Nazario Gonzalez
(74) *Attorney, Agent, or Firm* — Blank Rome LLP

(57) ABSTRACT

Nanoparticles containing IUPAC group 11 ions, group 13 ions and sulfur ions are synthesized by adding metal salts and an alkanethiol in an organic solvent and promoting the reaction by applying heat. Nanoparticles are formed at temperatures as low as 200° C. The nanoparticles may be thermally annealed for a certain amount of time at a temperature lower than the reaction temperature (usually ~40° C. lower) to improve the topology and narrow the size distribution. After the reaction is complete, the nanoparticles may be isolated by the addition of a non-solvent and re-dispersed in organic solvents including toluene, chloroform and hexane to form a nanoparticle ink. Additives may be incorporated in the reaction solution to tailor the final ink viscosity.

16 Claims, 7 Drawing Sheets

(5 of 7 Drawing Sheet(s) Filed in Color)

(56) References Cited

OTHER PUBLICATIONS

J. Zhong et al., Sphere-like CuGaS2 nanoparticles synthesized by a simple biomolecule-assisted solvothermal route Appl. Surf. Sci., 2011, 257, 10188.

Y-H.A. Wang et al., Synthesis of Shape-Controlled Monodisperse Wurtzite CuInxGa1-xS2 Semiconductor Nanocrystals with Tunable Band Gap J. Am. Chem. Soc., 2011, 133, 11072.

S-H. Chang et al., Facile colloidal synthesis of quinary CuIn1-xGax(SySe1-y)2 (CIGSSe) nanocrystal inks with tunable band gaps for use in low-cost photovoltaics Energy Environ. Sci., 2011, 4, 4929.

Q. Guo et al., Sulfide Nanocrystal Inks for Dense Cu(In1-xGax)(S1-ySey)2 Absorber Films and Their Photovoltaic PerformanceNano Lett., 2009, 9, 3060.

C. Sun et al., Controlled Stoichiometry for Quaternary CuInxGa1-xS2 Chalcopyrite Nanoparticles from Single-Source Precursors via Microwave Irradiation Chem. Mater., 2010, 22, 2699.

COPPER-INDIUM-GALLIUM-CHALCOGENIDE NANOPARTICLE PRECURSORS FOR THIN-FILM SOLAR CELLS

CROSS-REFERENCE TO RELATED APPLICATIONS

This application is a non-provisional of U.S. Provisional Patent Application 61/772,372, filed Mar. 4, 2013, the entire contents of which are incorporated herein by reference.

BACKGROUND

1. Field of the Invention

This invention relates to photovoltaic materials. More particularly, it relates to the fabrication of $CuIn_xGa_{1-x}S_2$ ($0 \leq x \leq 1$) nanoparticles.

2. Description of the Related Art Including Information Disclosed Under 37 CFR 1.97 and 1.98

To be commercial viable, photovoltaic cells must generate electricity at a cost that is competitive with fossil fuels. The photovoltaic cells must be made using low cost materials and by inexpensive device fabrication processes. Photovoltaic cells must be capable of moderate to high conversion efficiency of sunlight to electricity. And the materials synthesis and device fabrication must be commercially scalable.

The photovoltaic market is currently dominated by silicon wafer-based solar cells (a.k.a. first-generation solar cells). The active layer in these solar cells is made of single-crystal silicon wafers having a thickness typically ranging from a few microns to hundreds of microns, a thickness that is relatively large. A thick active layer is required because silicon is relatively poor at absorbing light. These single-crystal wafers are relatively expensive to produce because the process involves fabricating and slicing high-purity, single-crystal silicon ingots. The yield of that process is often low.

The high cost of crystalline silicon wafers has prompted the industry to seek less expensive materials for solar cells. Semiconductor materials such as copper indium/gallium disulfides/selenides $CuIn_xGa_{1-x}S_2$ ($0 \leq x \leq 1$) (referred to herein generically as CIGS) are strong light absorbers and have bandgaps that match well with the optimal spectral range for photovoltaic applications. Furthermore, because these materials have strong absorption coefficients, the active layer in solar cells using these materials need be only a few microns thick.

Copper indium diselenide ($CuInSe_2$) is one of the most promising candidates for thin film photovoltaic applications. However, solar cells based on $CuInSe_2$ can be made by selenizing films of $CuInS_2$. During selenization, films of $CuInS_2$ are heated in a selenium-rich atmosphere, causing selenium to replace sulphur in some or all locations within the film, because when Se replaces S the substitution creates volume expansion, which reduces void space within the film and reproducibly forms a high quality, dense $CuInSe_2$ absorber layer. Assuming complete replacement of S with Se, the resulting lattice volume expansion is approximately 14.6% (calculated based on the lattice parameters of chalcopyrite (tetragonal) $CuInS_2$ (a=5.52 Å, c=11.12 Å) and $CuInSe_2$ (a=5.78 Å, c=11.62 Å)). A $CuInS_2$ nanoparticle film may be converted to a predominantly selenide material by annealing the film in a selenium-rich atmosphere. $CuInS_2$ nanoparticles are a promising as precursors for producing the $CuInSe_2$ active layer. An advantage of using $CuInS_2$ nanoparticles instead of simply using $CuInSe_2$ nanoparticles is that the sulphur precursors are usually less expensive and more readily available than their selenium counterparts.

The theoretical optimum bandgap for absorber materials is about 1.3-1.4 eV. By incorporating gallium into $CuInS_2$ nanoparticles, the bandgap can be manipulated so that, following selenisation, the $CuIn_xGa_{1-x}Se_2$ absorber layer has an optimal bandgap for solar absorption.

Conventionally, costly vapor phase or evaporation techniques (e.g., organometallic chemical vapor deposition, RF sputtering, flash evaporation and the like) have been used to deposit the copper indium (gallium) disulfide films on substrates. While those techniques can produce high quality films, they are difficult and expensive to scale to large-area depositions and higher process throughputs.

One of the major advantages of using nanoparticles of copper indium chalcogenide and/or copper indium gallium chalcogenide is that the nanoparticles may be dispersed in a medium so as to form ink that may be printed on a substrate similar to inks in a newspaper-type process. The nanoparticle ink or paste may be deposited using low-cost printing techniques such as spin coating, slit coating or doctor blading. Printable solar-cells may replace the standard, conventional vacuum-deposited methods of manufacturing solar cells because the printing processes, especially when implemented in a roll-to-roll processing framework, enables a much larger throughput.

Nanoparticles of the ternary $CuInS_2$ system have been prepared with various synthetic methods including the hot-injection method, solvothermal techniques, and thermal decomposition of suitable precursors. Colloidal nanoparticle synthesis typically employs high temperatures (above 250° C.), to form small (<20 nm), organic-capped nanoparticles. As such, colloidal nanoparticles display lower melting points than the bulk material. Such nanoparticles often have a narrow melting temperature range because the nanoparticles are highly monodisperse (i.e., the diameters of the nanoparticles are within a narrow size distribution). There is very little published literature on the synthesis of $CuInGaS_2$ and $CuGaS_2$ nanoparticles as the majority of the published literature focus on the ternary compound $CuInS_2$.

U.S. Patent Application US 2011/0039104 A1 from Bayer (the '104 Application) describes a process for the colloidal synthesis of $CuInS_2$ nanoparticles using copper salts, indium salts and an alkane thiol in a non-polar organic solvent at a reaction temperature between 240-270° C. is employed. The method described in the '104 Application does not demonstrate tunability to synthesise $CuIn_xGa_{1-x}S_2$ nanoparticles and does not demonstrate that tailoring of the initial metal ratio and choice of reagents can be used to obtain the desired stoichiometry. Further, to employ the reaction temperatures described in the '104 Application, a high-temperature boiling thiol is required.

In another example, Kino et al. report a method of synthesising $CuInS_2$ nanoparticles by mixing $Cu(OAc)_2$ and $In(OAc)_3$ with 1-dodecanethiol and tri-n-octylamine at 230° C. [T. Kino et al., *Mater. Trans.*, 2008, 49, 435]. Tri-n-octylamine is a highly coordinating solvent (with a boiling point of 365-367° C.), therefore it is likely that the nanoparticles synthesised using the Kito et al. method are at least partially amine-capped. If using the particles for photovoltaic devices, this is unfavourable since high processing temperatures are required to remove the amine from films made of the nanoparticles.

The hot-injection route usually consists of injecting a solution of sulphur in an appropriate solvent, such as trioctylphosphine (TOP) or oleylamine (OLA), into a solution of copper and indium salts at high temperature. Zn-doped $CuInS_2$ nanoparticles have been prepared via this method at temperatures between 160-280° C. [H. Nakamura et al., *Chem. Mater.*, 2006, 18, 3330]. A drawback of hot-injection techniques is that it is difficult to control the reaction temperature on a large scale, so reactions are generally restricted to milligram scales and typically require large reaction volumes.

Single-source precursor (SSP) methods for nanoparticle synthesis employ a single compound that contains all of the constituent elements to be incorporated into the nanoparticle. Under thermolysis, the SSP decomposes leading to nanoparticle formation. There are a number of references that describe the synthesis of $CuInS_2$ nanoparticles from SSPs. $CuInS_2$ nanoparticles were prepared by using precursors of the type $(PR_3)_2Cu(SR)_2In(SR)_2$, where R is an alkyl group. Castro et al. decomposed the liquid precursor $(PPh_3)_2CuIn(SEt)_4$ in dioctyl phthalate between 200-300° C. to yield chalcopyrite $CuInS_2$ nanoparticles of sizes between 3-30 nm [S. L. Castro et al., *Chem. Mater.*, 2003, 15, 3142]. Despite their small size, the nanoparticles were insoluble in organic solvent due to their tendency of forming large 500 nm aggregates.

Dutta and Sharma used the xanthate precursors $In(S_2COEt)_3$ and $Cu(S_2COEt)$ in ethylene glycol at 196° C. to obtain tetragonal $CuInS_2$ with an average size of 3-4 nm with occasional aggregation [D. P. Dutta and G. Sharma, *Mater. Lett.*, 2006, 60, 2395]. The $CuInS_2$ nanoparticles prepared by these SSPs displayed very poor solubility and a tendency to form micron-sized aggregates because non-coordinating solvents were employed. SSP processes are complicated than other methods because they require an extra step to synthesise the precursors.

Other routes consist of reacting metal salts with a sulphur source. Choi et al. prepared Cu—In—S nanoparticles by decomposing copper and indium metal-oleate complexes with dodecanethiol in OLA at temperatures between 230-250° C. [S-H, Choi et al., *J. Am. Chem. Soc.*, 2006, 128, 2520]. In this process the metal-oleate was synthesised, isolated and purified before being reacted with the alkyl thiol. The particles were fairly large with the particle shape being tailored to acorns, bottles, and larva-shape rods, with lengths between 50-100 nm, by changing the reaction time and temperature. However the XRD analysis revealed that the nanoparticles were composed of a mixture of hexagonal chalcocite-structured $Cu_2S$ and tetragonal-structured $In_2S_3$ rather than $CuInS_2$. Carmalt et al. produced micron-sized $CuInS_2$ particles by reaction of metal chlorides with sodium sulphide in refluxing toluene at 110° C., but this material had very limited solubility [C. J. Carmalt et al., *J. Mater. Chem.*, 1998, 8, 2209].

Solvothermal methods have been explored as a route to nanoparticle synthesis. However, the particle size distribution is typically large and the nanoparticles are often poorly soluble due to the formation of aggregates. Micron-sized $CuInS_2$ particles were prepared by mixing $CuSO_4$, $InCl_3$, and thioacetamide in the presence of thioglycolic acid inside an autoclave [X. Guo et al., *J. Am. Chem. Soc.*, 2006, 128, 7222]. Lu et al. prepared tetragonal $CuInS_2$ nanoparticles by reacting CuCl and metallic In with sulphur powder in a range of solvents including toluene, benzene, and water at 200° C. inside an autoclave [Q. Lu et al., *Inorg. Chem.*, 2000, 39, 1606]. The particles had sizes between 5-15 nm, but formed large aggregates and were insoluble. Toluene, benzene or water was used as the reaction medium. TEM images showed poor control over the particle size distribution, which varied depending on the reaction medium. Additionally, Hu et al. report the solvothermal synthesis of $CuGaS_2$ nanoparticles using CuCl, $GaCl_3$ and thiourea [J. Q. Hu et al., *Solid State commun*, 2002, 121, 493].

A biomolecule-assisted synthesis of $CuGaS_2$ nanoparticles was reported by Zhong et al. [J. Zhong et al., *Appl. Surf. Sci.*, 2011, 257, 10188]. $CuCl_2 \cdot 2H_2O$, $GaCl_3$ and L-cysteine ($C_6H_{12}N_2O_4S_2$) were dissolved in ethylenediamine and water then stirred at room temperature for 20 minutes. The solution was heated to 200° C. in an autoclave for 10 hours, TEM analysis showed large nanoparticles with an average diameter of 600 nm.

Though there is substantial interest in developing synthetic methods to provide quaternary and higher nanoparticles, few methods of $CuInS_2$ and/or $CuGaS_2$ nanoparticle synthesis in the prior art have been proven to be adaptable to provide $CuIn_xGa_{1-x}S$ nanoparticles across the $0 \leq x \leq 1$ range. Wang et al. describe the colloidal synthesis of wurtzite $CuIn_xGa_{1-x}S_2$ nanoparticles in the range $0 \leq x \leq 1$ [Y-H. A. Wang et al., *J. Am. Chem. Soc.*, 2011, 133, 11072]. $Cu(acac)_2$, $In(acac)_3$, $Ga(acac)_3$ and trioctylphosphine oxide (TOPO) were stirred in OLA at room temperature and purged with nitrogen for 30 minutes. The solution was heated to 150° C., then 1-dodecanethiol (DDT) and tert-DDT were injected rapidly into the solution, which was then heated to 280-290° C. in 30 minutes, then held for 30 minutes. The solution was cooled to room temperature then isolated by centrifugation using hexane and ethanol. By substituting OLA with 1-octadecene (ODE), the nanoparticle morphology could be changed from bullet-like to tadpole-like. Morphological variation was also observed when changing the In:Ga ratio. The authors claim that the wurtzite phase offers flexibility to control the stoichiometry of the material.

Though the method outlined by Wang et al. can be used to synthesise $CuIn_xGa_{1-x}S_2$ nanoparticles across the entire $0 \leq x \leq 1$ range, the nanoparticles are capped with high boiling ligands: OLA (348-350° C.), TOPO (201-202° C. at 2 mm Hg, which equates to 397-399° C. at atmospheric pressure), 1-DDT (266-283° C.) and/or tert-DDT (227-248° C.). Thus, high temperature device manufacturing techniques are required to remove the ligand from the resulting films. Moreover, with the Wang et al. method, the uncommon wurtzite phase of $CuInS_2$ is obtained. In contrast, current solar cells use the chalcopyrite phase as the absorber.

Chang et al. describe the synthesis of the quinary $Cu(In_xGa_{1-x})(S_ySe_{1-y})_2$ nanoparticles in the range $0 \leq x,y \leq 1$, which enables tuning of the bandgap from 0.98-2.40 eV [S-H, Chang et al., *Energy Environ. Sci.*, 2011, 4, 4929]. In a typical reaction, CuCl, $InCl_3$ and/or $GaCl_3$, Se and/or S were mixed with OLA, then purged with Ar at 130° C. for 1 hour under vigorous stirring. The solution was heated to 265° C. then held for 90 minutes, after which the reaction was quenched in a cold water bath. The product was isolated by centrifugation with hexane/ethanol. For x,y~0.5, the average particle diameter was 16±0.5 nm, with a slightly irregular faceted morphology. A similar reaction is reported by Guo et al. Colloidal $CuIn_xGa_{1-x}S_2$ nanoparticles were synthesised with an average particle diameter of 15 nm when x=1 [Q. Guo et al., *Nano Lett.*, 2009, 9, 3060]. In a typical synthesis, CuCl, $InCl_3$ and/or $GaCl_3$ were dissolved in OLA and purged under Ar at 130° C. for 30 minutes. The solution was heated to 225° C., then a 1 M S/OLA solution was injected in quickly. The reaction was held at 225° C. for 30 minutes, then cooled and isolated by centrifugation with toluene/ethanol. The resulting nanoparticles have a very low organic content (<10%), making them insoluble in organic and polar solvents and difficult to process as a printable ink.

Combinations of In-containing and Ga-containing SSPs have been used to synthesise Cu(In,Ga)S$_2$ nanoparticles. Sun et al. used a mixture of two single source precursors, (Ph$_3$P)$_2$Cu(μ-SEt)$_2$In(SEt)$_2$ and (Ph$_3$P)$_2$Cu(μ-SEt)$_2$Ga(SEt)$_2$, in varying ratios to synthesise CuIn$_x$Ga$_{1-x}$S$_2$ nanoparticles across the 0≤x≤1 range [C. Sun et al., *Chem. Mater.*, 2010, 22, 2699]. In a typical synthesis, (Ph$_3$P)$_2$Cu(μ-SEt)$_2$In(SEt)$_2$ and (Ph$_3$P)$_2$Cu(μ-SEt)$_2$Ga(SEt)$_2$ were dissolved in benzyl acetate in the presence of 1,2-ethanedithiol, then irradiated in a microwave at 160° C. for less than 1 hour. Microwave irradiation was employed to provide greater homogeneity in the reaction temperature than traditional thermolysis. Nanoparticle diameters ranged from 2.7-3.3 nm, increasing with an increase in In content, and the bandgap could be tuned from 1.59 eV (for x=1) to 2.3 eV (for x=0). Increasing the reaction temperature was shown to increase the particle size and decrease the band gap. Though the SSP method described by Sun et al. allows tunability of the In to Ga ratio, the ratio of Cu to (In+Ga) is determined by the stoichiometry of the single source precursors and cannot be altered.

A U.S. Pat. No. 7,892,519 describes an SSP method for producing Cu(In,Ga)S$_2$ nanoparticles capped with a thiolate ligand. However the disclosure only exemplifies methods to synthesise CuInS$_2$.

The solvothermal synthesis of CuIn$_{0.5}$Ga$_{0.5}$S$_2$ 1-2 μm flowers, consisting of nanoflakes of 15 nm thickness, is described by Liang et al. [X. Liang et al., *J. Alloys & Compounds*, 2011, 509, 6200]. In a typical reaction, CuCl$_2$.2H$_2$O, GaCl$_3$, InCl$_3$, and L-cysteine were dissolved in DMF by stirring for 10 minutes. The solution was heated in an autoclave at 220° C. for 10 hours, then cooled to room temperature. The solid was precipitated with deionised water, then dried under vacuum.

The synthetic methods described in the prior art generally produce large nanoparticles that have a tendency to aggregate and are insoluble in most solvents. This is an important issue because it is desirable to produce small and soluble nanoparticles that may be further processed to formulate an ink to make inorganic films by conventional and low-cost techniques like printing or spraying. Capping ligands, such as hydrocarbons, can be associated with the surface of the nanoparticles to aid in the processability. However, the synthetic procedures described above are carried out at a high temperature, which limits the choices of capping ligands to those ligands having a relatively high vaporization/decomposition temperature. The presence of such low volatility capping ligands complicates the use of the nanoparticles for the preparation of photovoltaic films because it is difficult to remove the ligands during the sintering of the films. The presence of removed ligand in the film results in carbon-based impurities, which adversely affect the performance of the films.

Because the known methods are not able to produce nanoparticles that are small, have low melting points, narrow size distribution, and incorporate a volatile ligand that may confer solubility and processability, these methods are not very well-suited for producing nanoparticles compatible with the conventional low-cost film printing techniques. Further, few methods have been proven successful for synthesising CuIn$_x$Ga$_{1-x}$S$_2$ nanoparticles spanning the entire 0≤x≤1 range. An object of the present disclosure is to solve these problems.

SUMMARY

The present method yields small CuInS$_2$ and CuIn$_x$Ga$_{1-x}$S$_2$ nanoparticles (with sizes down to about 2.5 nm in diameter and generally in the range 2.5 nm to about 10 nm) with narrow size distributions. The nanoparticles may be capped with a volatile alkyl thiol and are soluble in a range of solvents. The nanoparticles may be dispersed in a solvent, such as toluene, to formulate an ink that may be deposited to form CuInS$_2$ or CuIn$_x$Ga$_{1-x}$S$_2$ films using conventional low-cost printing techniques like spraying, doctor-blade coating, bar coating, ink-jet printing and the like.

Nanoparticles made using the disclosed process generally have a lower melting point compared to bulk material and pack more closely, which facilitates coalescence of the particles during melting, resulting in improved film quality. This allows lower processing temperatures, opening the possibility of using flexible substrates (for example, paper and plastic) as components in PV cells. Because melting point can change with particle size, nanoparticles having a narrow size distribution will melt approximately at the same temperature, producing a high quality film.

A significant advantage provided by the use of a low-boiling alkyl thiol is that it can be easily and cheaply removed from the nanoparticles by mild heating. This is important because carbon impurities from ligand residues remaining in the film after the baking process may cause deterioration in the performance of the solar cell. Another advantage is that the alkyl thiol acts both as a sulfur source and as a ligand, which simplifies the synthesis.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
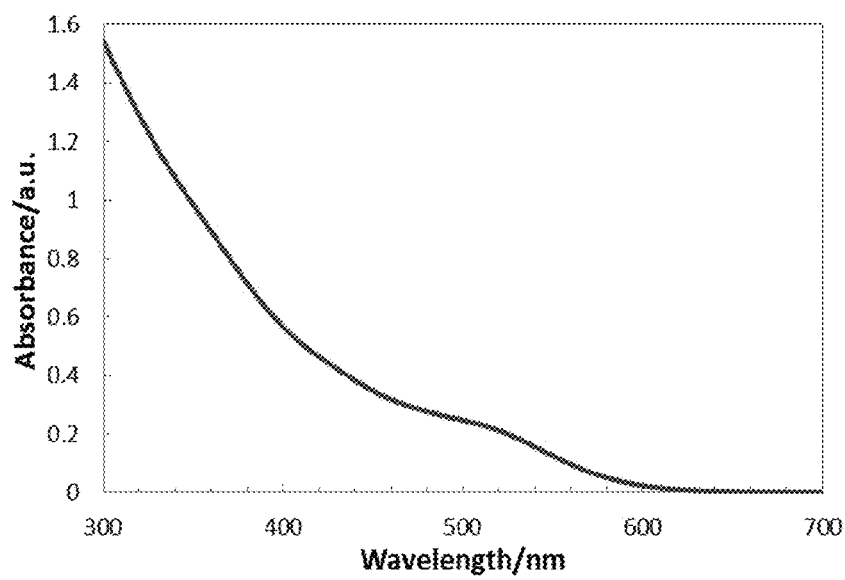
FIG. 1 shows an absorption spectrum of CuInS$_2$ nanoparticles prepared by the disclosed process.

Disclosed is a process for producing nanoparticles comprising group 11 ions [Cu, Ag or Au] and group 13 ions [B, Al, Ga, In or Tl] and S ions. A preferred embodiment produces nanoparticles having the formula $CuIn_xGa_{1-x}S_2$ wherein $0 \leq x \leq 1$ range. As used herein, the formula $CuInS_2$ refers to materials comprising Cu, In, and S. It will be understood that the formula does not necessarily indicate that the Cu:In:S ratio is exactly 1:1:2. Likewise, the formula $Cu(In,Ga)S_2$ refers to a material having Cu, In, Ga, and S, but does not necessitate that the Cu:In:Ga:S ratio is exactly 1:1:1:2. The term "CIGS" is herein used to define any material containing Cu and S and/or In and/or Ga.

Nanoparticles, as disclosed herein, can be formed at temperatures as low as 200° C. or lower by reacting group 11 and group 13 ion sources and an alkane thiol in an organic solvent and promoting the reaction by applying heat. Group 11 and group 13 ion sources are generally metal salts, for example, acetate salts or halide salts of the desired metal ion. The thiol compound may be represented by the formula R—SH, where R is a substituted or unsubstituted organic group, (i.e., one or more hydrogen atoms bonded to a carbon atom may be replaced with a non-hydrogen atom). The organic group may be saturated or unsaturated. The organic group is preferably a linear, branched or cyclic organic group, which may be a carboxyl group or a heterocyclic group.

The organic group is preferably an alkyl, alkenyl, alkynyl, and/or aryl. The organic group may be an alkyl, alkenyl or alkynyl group containing 2 to 20 carbon atoms, more preferably 4 to 14 carbon atoms and most preferably 10 or less carbon atoms.

The thiols serve two purposes in the synthesis. Firstly, they are a source of sulphur for the nanoparticle. Secondly, the thiols act as surface-bound ligands. The thiols bind to the surfaces of the nanoparticles, forming a ligand layer upon the surfaces. The ligand layer can be formed almost exclusively of thiol. In other words, some amount of solvent molecules may adhere to the ligand layer or be intercalated within the layer, but the vast majority of the ligand layer may be formed of thiol ligands. It will also be appreciated that the term "layer" does not necessitate that the ligand layer is a complete monolayer or is limited to one monolayer. Greater or fewer thiol molecules may be present on the nanoparticle surface than a single monolayer.

It will be appreciated that an advantage of the presently disclosed process over the methods described in the Background section above is that the presently disclosed process operates at a lower temperature. Typically S sources used in the synthesis of CIGS require temperature greater than 200° C. to react. But the disclosed process allows lower-boiling alkyl thiols to be used as a capping agent during the synthesis.

The use of low boiling alkane thiol ligands is advantageous because it facilitate the removal of the ligands from films at relatively low temperatures. Low temperature removal enables low temperature device processing. According to some embodiments, the surface-bound thiols are ejected from the surface of the nanoparticles when the nanoparticles are heated to 350° C., or greater. As used herein, "ejected" can mean that the thiols decompose, evaporate, or otherwise are removed from the nanoparticle surface. According to other embodiments, the thiols are ejected when the nanoparticles are heated to 300° C. or greater, 250° C. or greater, or 200° C. or greater.

According to various embodiments, the alkane thiol can contain ten carbons or less, eight carbons or less, or six carbons or less. A particularly suitable alkane thiol is n-octane thiol, which has a boiling point of about 200° C. Alternatively, branched alkane thiols, for example, tertiary thiols, can be used. According to one embodiment, a branched thiol is used as the sulphur source and a short-chain low boiling linear thiol, is used as the capping ligand. Tertiary thiols like tert-nonylmercaptan decompose at much lower temperature than their linear equivalent thiols. tert-Nonylmercaptan decomposes at ~100° C. Thus, CIGS made with tertiary thiols can be synthesized at lower temperatures, allowing the use of short-chained, lower boiling ligands as capping agents. A typical example, butanethiol, is too volatile to be introduced in CIGS synthesized at 200° C., as its boiling point is ~100° C. However, butane thiol can be used as a capping ligand in conjunction with a tertiary thiol used as a sulphur source. Another advantage of the tertiary thiols is that they react 'cleanly' e.g. without leaving any by-products on the final nanoparticles.

Thus, one object of the disclosure is to provide nanoparticles having the formula $CuIn_xGa_{1-x}S_2$ capped with alkyl thiol capping ligands, particularly alkyl thiol capping ligands of ten carbons or less, and preferably eight carbons or less. According to one embodiment, the capping ligand has less than six carbons. According to one embodiment, the capping ligand has four carbons.

Following the initial reaction, the nanoparticles may be thermally annealed for a certain amount of time at a temperature lower than the reaction temperature (usually ~40° C. lower) to improve the topology and narrow the size distribution.

Nanoparticle made using the described process are generally less than 10 nm in diameter and are more typically as small as about 2.5 nm in diameter. The described process provides nanoparticles populations having a high degree of monodispersity. For example, nanoparticles prepared using the described process may exhibit an emission spectrum having a FWHM of less than about 200 nm and more preferably less than about 150 nm or less than about 100 nm.

After the reaction is complete, the nanoparticles may be isolated by the addition of a non-solvent and re-dispersed in organic solvents, such as toluene, chloroform and/or hexane to form nanoparticle ink. Additives, such as additional thiol, can be incorporated into the reaction solution to tailor the final ink viscosity. According to certain embodiments a sufficient quantity of the nanoparticles is combined with the ink base such that the resulting ink formulation includes up to around 50% w/v of the nanoparticles, more preferably around 10 to 40% w/v of the nanoparticles, and most preferably around 20 to 30% w/v of the nanoparticles. According to other embodiments the nanoparticle concentration may be made as high as possible. It is within the ability of a person of skill to adjust the nanoparticle concentration of the ink to best suit their operational parameters.

The nanoparticle ink can be printed onto a supporting layer to form a thin film including nanoparticles incorporating ions selected from groups 11, 13, and 16 of the periodic table. Preferably, formation of the film includes depositing a formulation containing the nanoparticles by printing, coating or spraying onto a supporting layer under conditions permitting formation of the thin film on the supporting layer. Deposition of the nanoparticle formulation may be achieved using any appropriate method but it preferably includes drop casting, doctor blading and/or spin coating. When spin coating is used, the spin coating may be effected using a spinning speed of up to around 5000 rpm, more preferably a spinning speed of around 500 to 3500 rpm, and most preferably a spinning speed of around 2000 rpm. Alternatively or additionally, the spin coating may be effected over a time period of up to around 300 seconds, more preferably a time period of around 20 to 150 seconds, and most preferably a time period of around 60 seconds.

Formation of the film generally includes one or more annealing cycles including a series of steps in which the temperature of the nanoparticle formulation deposited on the supporting layer is repeatedly increased and subsequently maintained at the increased temperature for a predetermined period of time, following which the nanoparticle formulation is cooled to form the film. Preferably each of the series of steps is affected to provide an increase in temperature of the nanoparticle formulation of around 10 to 70° C. Initial steps may be effected to provide larger temperature increases than later steps. By way of example, a first of such steps may effect a temperature increase of around 50 to 70° C., followed by one or more subsequent steps in which the temperature is increased by around 10 to 20° C. Each of the series of steps preferably includes increasing the temperature of the nanoparticle formulation at a rate of up to around 10° C./minute, more preferably at a rate of around 0.5 to 5° C./minute and most preferably at a rate of around 1 to 2° C./minute. In one example, initial steps may involve temperature increases at a greater rate than later steps. For example, in a preferred embodiment, one or two of the initial steps may include heating to provide temperature increases of around 8 to 10° C./minute, while later steps may involve temperature increases of around 1 to 2° C./minute. As mentioned above, each step involves heating and then maintaining the nanoparticle-containing formulation at the increased temperature for a predetermined period of time.

Example 1

Synthesis of $CuInS_2$ Nanoparticles Using Octanethiol

Figure 2:
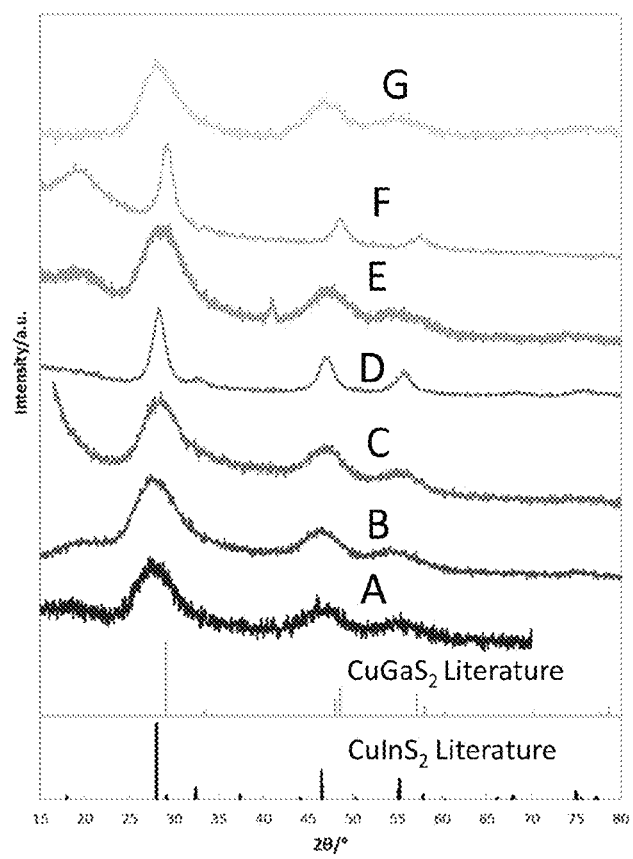
FIG. 2 shows the X-ray diffraction patterns of nanoparticles prepared according to the disclosed process.

Cu(OAc) (122.3 mg, 0.9976 mmol; OAc=acetate) and $In(OAc)_3$ (292.0 mg, 1.000 mmol) were mixed in 5 mL of 1-octadecene and heated at 120° C. for 20 min. The mixture was backfilled with nitrogen gas and 5 mL of octanethiol were injected to produce a yellow/orange suspension. The suspension was heated to 200° C. and maintained at this temperature for 1 h during which time it turned red in color. The reaction was left annealing for 17 h at 170° C., cooled to room temperature and the product was isolated with acetone. The resulting flocculated solid was collected by centrifugation, re-dispersed in chloroform, filtered and washed with a further cycle of precipitation in acetone. The absorption spectrum (see FIG. 1) of an optically clear solution of nanoparticles shows a well-marked exciton peak at 525 nm, with an absorption edge at around 640 nm, which is significantly blue-shifted from that of bulk $CuInS_2$ (810 nm) and is consistent with the expected quantum confinement effect. The XRD pattern (shown in FIG. 2 A) matched well with the published tetragonal $CuInS_2$ phase.

Example 2

Synthesis of $CuInS_2$ Nanoparticles Using Octanethiol

An oven-dried 1-liter, 3-neck round bottom flask was charged with 30.121 g $In(OAc)_3$ (103 mmol), 12.002 g Cu(OAc) (97.9 mmol) and 180 ml 1-octadecene. The flask was fitted with a Liebig condenser and purged with nitrogen gas. The mixture was degassed at 100° C. for 1 hour and then backfilled with nitrogen gas.

140 ml of degassed 1-octanethiol were added quickly with a syringe. The mixture was heated at 125° C. for 30 minutes, 200° C. for 2 hrs then cooled to 160° C. and left to anneal for 16 hrs.

The mixture was cooled to room temperature then the flask was opened to the atmosphere. The reaction mixture was spun at 4000 rpm for 5 minutes. The dark brown/orange supernatant as transferred to a glass bottle.

This solid was dispersed in 25 ml toluene and 25 ml of acetone were added. The mixture was spun in a centrifuge at 4000 rpm for 5 minutes. The dark supernatant was set aside and the gummy solid extracted with a further ml each toluene and acetone. The solid was again isolated by centrifugation (4000 rpm, 5 minutes). The supernatant was combined with the last and the solid was discarded. To the combined supernatants were added 100 ml methanol and 75 ml acetone and the mixture spun at 6500 rpm for 3 minutes. The cloudy, pale orange supernatant was discarded and the remaining dark, oily solid was set aside.

To the bulk of the reaction solution were added 400 ml methanol and 600 ml acetone and the mixture spun at 4000 rpm for 5 minutes. The colorless supernatant was discarded leaving a dark oil which was extracted twice further with 400 ml each methanol and acetone isolating each time by centrifugation and decantation of the supernatant.

Figure 3:
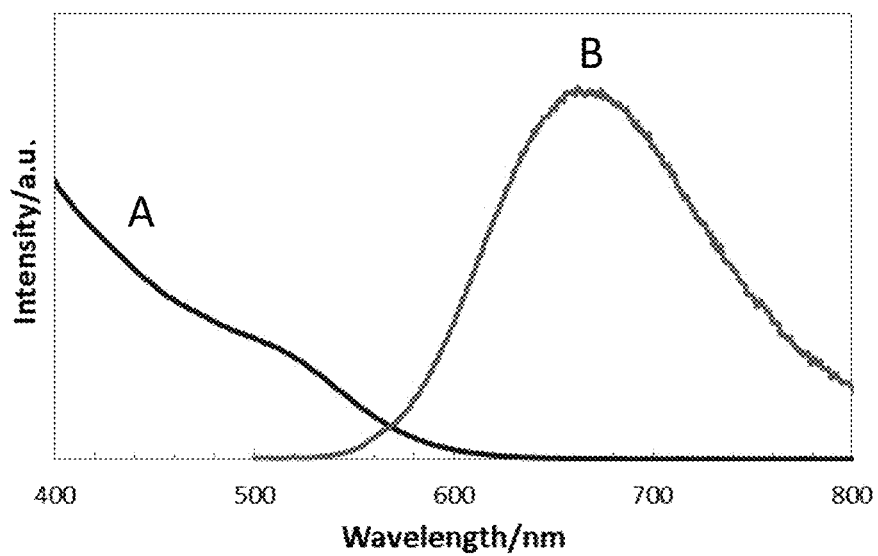
FIG. 3 shows optical spectra of CuInS$_2$ nanoparticles prepared according to the disclosed process.

The remaining solids were combined and rinsed with 200 ml acetone then thoroughly dispersed in 100 ml dichloromethane. The product was precipitated by addition of 800 ml 1:1 methanol acetone and isolated by centrifugation. The solid was further re-precipitated from dichloro-methane/methanol (100:400 ml). The solid was isolated by centrifugation (4000 rpm, 5 minutes) dried under vacuum for ~90 minutes, then stored under nitrogen gas. 39.479 g of material were collected. The elemental ratio of this compound was found to be $Cu_{1.0}In_{1.15}S_{1.70}$ by inductively coupled plasma optical emission spectroscopy (ICP-OES) analysis (13.09% Cu, 27.32% In, 11.22% S by weight). The thiol capping agent contributes to the total sulphur content. The resulting nanoparticles were characterized by an absorption peak at ~510 nm and weak luminescence at ~680 nm which is consistent with the expected quantum confinement effect (FIGS. 3 A and 3 B, respectively).

Figure 4:
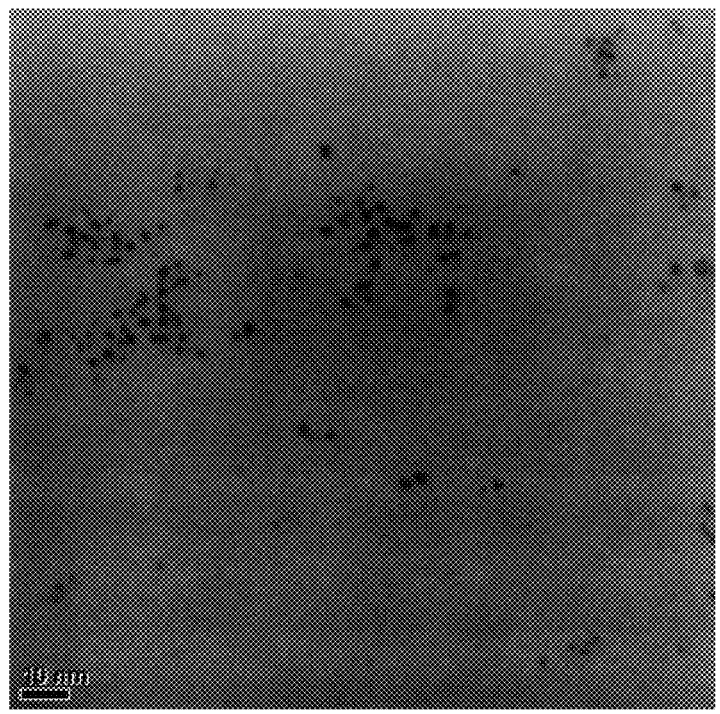
FIG. 4 is a transmission electron micrograph of CuInS$_2$ nanoparticles prepared according to the disclosed process.

The peaks of the XRD pattern (FIG. 2 B) match very well with the values of XRD reference JCPDS 32-0339 and may be indexed as $CuInS_2$ with a tetragonal structure. The TEM image (FIG. 4) of the nanoparticles indicates an average size of 2.5 nm.

Example 3

Synthesis of $CuInS_2$ Nanoparticles Using Octanethiol and ODE:S

The flask was charged with 191.49 g $In(OAc)_3$ (0.66 mmol) and 122.39 g Cu(OAc) (1.00 mmol) and placed under vacuum at room temperature. 5 ml of octadecene were injected and the resulting green-colored suspension heated at 100° C. under vacuum for 20 minutes. The flask was back-filled with nitrogen and 5 ml of octanethiol (29 mmol) were injected and the temperature was raised to 200° C. As the temperature increased, the solution color turned gradually yellow, orange and finally reddish. The reaction solution was held at 200° C. for 10 minutes.

In the meantime, a 1M solution of sulfur in 1-octadecene (ODE) was heated under nitrogen in a 3-neck, round bottom flask until all the sulfur dissolved. 2.1 ml (2.1 mmol) of this solution were injected into the reaction solution and kept for 5 minutes at 200° C. The reaction solution was cooled to room temperature and a red solid was collected by centrifugation after the addition of 40 ml of acetone. The solid was dried under vacuum.

Example 4

Synthesis of CuInS$_2$ Nanoparticles Using Octanethiol and TOP:S

An oven dried 100-ml, 3-neck, round bottom flask was charged with 1.25 g In(OAc)$_3$ (4.28 mmol), 0.51 g Cu(OAc) (4.2 mmol) and 7.5 ml 1-octadecene. The flask was fitted with a Liebig condenser and purged with nitrogen gas. The mixture was degassed at 100° C. for 1 hour then at 140° C. for 10 minutes and backfilled with nitrogen gas. 5 ml of 1-octanethiol were added and the mixture was heated at 180° C. 5 ml of a 1.71 M solution of TOP:S were added at a rate of about 7.5 ml/hr. The solution was heated at 200° C. for 2 hr, then annealed at 160° C. for 18 hours. After annealing, the heating was discontinued and the reaction solution was allowed to cool to 60° C. 40 ml of methanol was added and the resulting mixture was stirred at room temperature for 1 hour, followed by a 15-minute period without stirring. The process was repeated one time. A red solid was isolated, washed with 50 mL of acetone and collected by centrifugation. The solid was dispersed in 30 ml of dichloromethane, filtered and re-precipitated with 75 mL of methanol. The solid was re-dispersed in 10 mL of dichloromethane, re-precipitated, and isolated. The peaks of the XRD pattern (FIG. 2 C) match very well with the values of JCPDS 32-0339 and may be indexed as CuInS$_2$ with a tetragonal structure.

Figure 5:
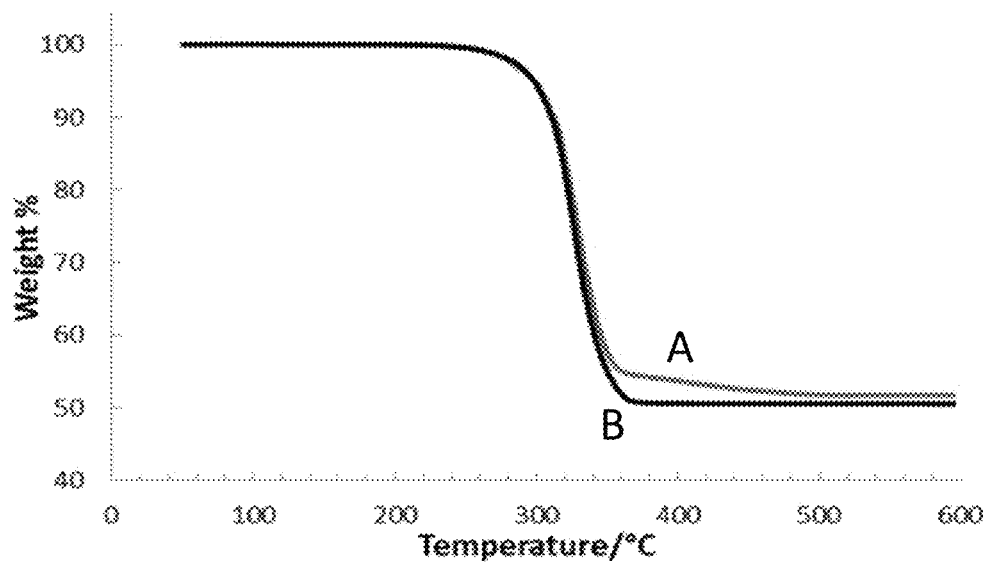
FIG. 5 shows thermogravametric analysis (TGA) of CuInS$_2$ nanoparticles prepared according to the disclosed process.

The TGA graph of this material shows a second step at 370° C. compared to the sample prepared in octanethiol alone (see FIG. 5). This reflects a different behavior of the materials in toluene, with the material prepared with TOP:S having a significantly higher viscosity, despite the total inorganic content being very similar.

Example 5

Synthesis of CuInS$_2$ Nanoparticles Using Hexadecanethiol

Figure 6:
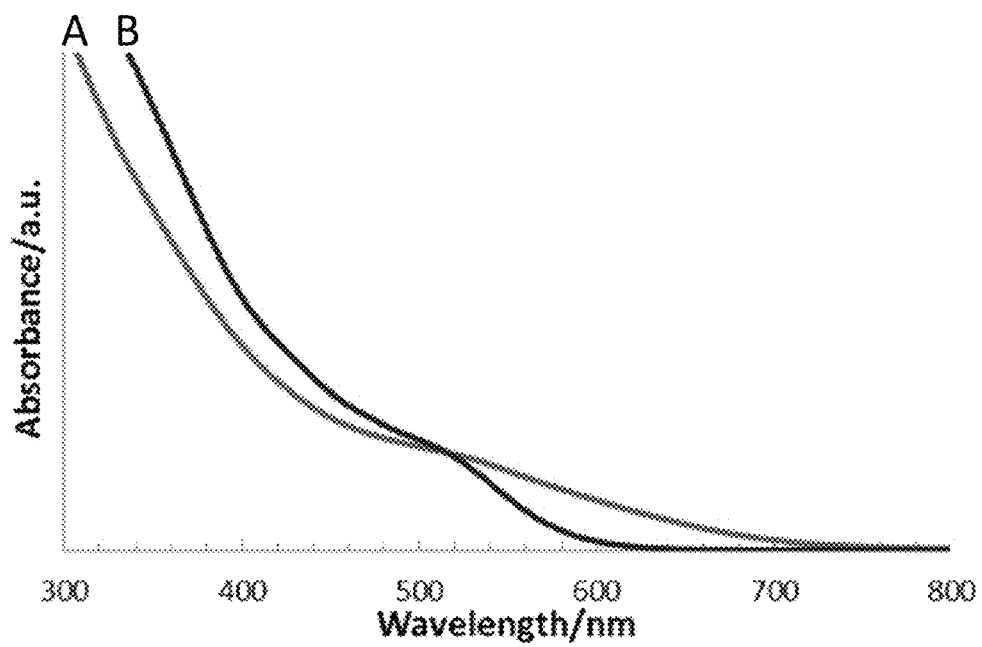
FIG. 6 show absorption spectra of nanoparticles prepared according to the disclosed process.

The flask was charged with 292.10 g In(OAc)$_3$, (1.00 mmol), 122.57Cu(OAc) and 5 ml of octadecene and heated to 120° C. under vacuum for 30 minutes. The green colored suspension was backfilled with nitrogen and 8.8 mL of hexadecanethiol were added to the flask to produce a yellow/orange suspension. The suspension was heated to 270° C. and its color changed gradually to deep red and finally brown. After 1 hour the suspension was cooled to room temperature and acetone was added to isolate the particles. Compared to the synthesis in octanethiol (FIG. 6 B), hexadecanthiol (FIG. 6 A) allowed to heat at higher temperature but yielded nanoparticles with a broader size distribution as shown in the absorption spectrum (FIG. 6).

Example 6

Synthesis of Cu(In,Ga)S$_2$ Nanoparticles

Cu(OAc) (1.48 g, 12.1 mmol), In(OAc)$_3$ (2.82 g, 9.66 mmol), GaCl$_3$ (1.28 g, 7.27 mmol) and ODE (25 mL) were loaded into a 250 mL round-bottomed flask and degassed at 100° C. for 2 hours. 1-Octanethiol (18 mL, 104 mmol) was added quickly and the temperature was raised to 125° C., then the solution was annealed for 30 minutes. The temperature was raised to 200° C. and the solution was annealed for 2 hours. The temperature was reduced to 160° C. and stirred overnight, before cooling to room temperature.

The cooled reaction mixture was centrifuged at 4000 rpm for 5 minutes. The top oily layer was decanted off and discarded. The solid was dispersed in acetone, then methanol was added and the mixture was centrifuged at 4000 rpm for 5 minutes. The solid was re-dispersed in acetone/methanol and centrifuged. After discarding the supernatant, the process was repeated twice further. The solid was dissolved in dichloromethane, then precipitated with acetone/methanol. After centrifugation at 4000 rpm for 5 minutes, the supernatant was discarded. The process was repeated, then the solid was dried under vacuum overnight, leaving a black solid as the product.

Elemental analysis by ICP-OES gave the following content by weight: 16.84% Cu, 25.25% In, 5.28% Ga, 18.8% S. This corresponds to a stoichiometry of CuIn$_{0.83}$Ga$_{0.29}$S$_{2.21}$. The thiol capping agent contributes to the total sulphur content.

XRD (FIG. 2 D) showed a characteristic chalcopyrite diffraction pattern, with peak positions and relative intensities intermediate between those of CuInS$_2$ and CuGaS$_2$ from the literature.

Figure 7:
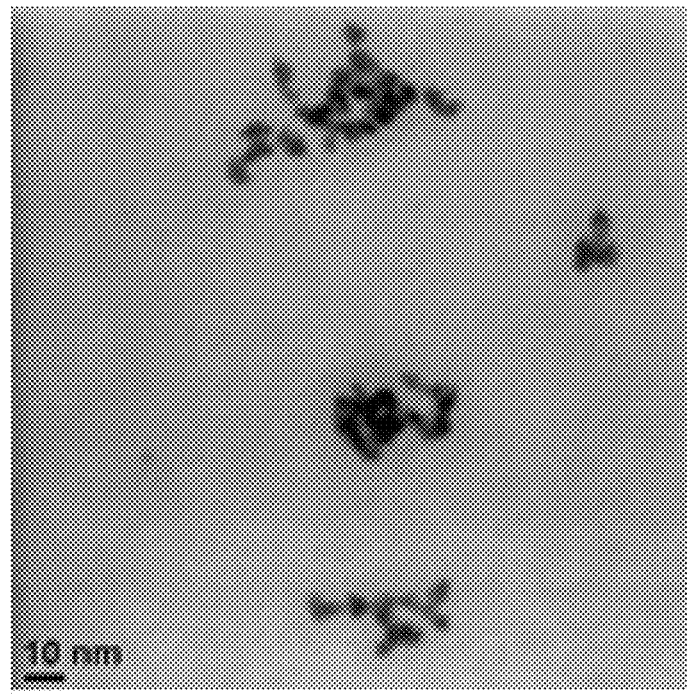
FIG. 7 is a transmission electron micrograph of nanoparticles prepared according to the disclosed process.

TEM revealed irregular shaped nanoparticles of ~4 nm diameter, as shown in FIG. 7.

Example 7

Synthesis of Cu(In,Ga)S$_2$ Nanoparticles

Cu(OAc) (1.48 g, 12.1 mmol), In(OAc)$_3$ (2.82 g, 9.66 mmol), GaCl$_3$ (0.73 g, 4.1 mmol) and ODE (25 mL) were loaded into a 250 mL round-bottomed flask and degassed at 100° C. for 1 hour. 1-Octanethiol (18 mL, 104 mmol) was added quickly and the temperature was raised to 125° C., then the solution was annealed for 30 minutes. The temperature was raised to 200° C. and the solution was annealed for 2 hours. The temperature was reduced to 160° C. and stirred overnight, before cooling to room temperature.

The cooled reaction mixture was centrifuged at 4000 rpm for 5 minutes. The top oily layer was decanted off and discarded. The solid (along with solid residue from the reaction flask) was dispersed in acetone by ultrasonication, then methanol was added and the mixture was centrifuged at 4000 rpm for 5 minutes. The supernatant was discarded. The solid was re-dispersed in acetone/methanol and centrifuged. After discarding the supernatant, the process was repeated twice further. The solid was dissolved in dichloromethane, then precipitated with acetone/methanol. After centrifugation at 4000 rpm for 5 minutes, the supernatant was discarded. The process was repeated, then the solid was dried under vacuum, leaving a black powder as the product.

Elemental analysis by ICP-OES gave the following content by weight: 16.44% Cu, 24.63% In, 3.86% Ga, 17.67% S. This corresponds to a stoichiometry of CuIn$_{0.83}$Ga$_{0.21}$S$_{2.23}$. The thiol capping agent contributes to the total sulphur content.

Example 8

Synthesis of Cu(In,Ga)S$_2$ Nanoparticles

Cu(OAc) (1.48 g, 12.1 mmol), In(OAc)$_3$ (2.82 g, 9.66 mmol), Ga(acac)$_3$ (2.67 g, 7.27 mmol;

acac=acetylacetonate) and ODE (25 mL) were loaded into a 250 mL round-bottomed flask and degassed at 100° C. for 1 hour. 1-Octanethiol (18 mL, 104 mmol) was added quickly and the temperature was raised to 125° C., then the solution was annealed for 30 minutes. The temperature was raised to 200° C. and the solution was annealed for 2 hours. The temperature was reduced to 160° C. and stirred overnight, before cooling to room temperature.

The cooled reaction mixture was dispersed in acetone by ultrasonication and the white solid isolated manually using a spatula and discarded. To the solution, methanol was added and the mixture was centrifuged at 4000 rpm for 5 minutes. The supernatant was discarded. The solid was re-dispersed in acetone/methanol and centrifuged. After discarding the supernatant, the process was repeated. The solid was dissolved in dichloromethane, then precipitated with acetone/methanol. After centrifugation at 4000 rpm for 5 minutes, the supernatant was discarded. The process was repeated, then the solid was dried under vacuum, leaving an reddish brown powder as the product.

Figure 8:
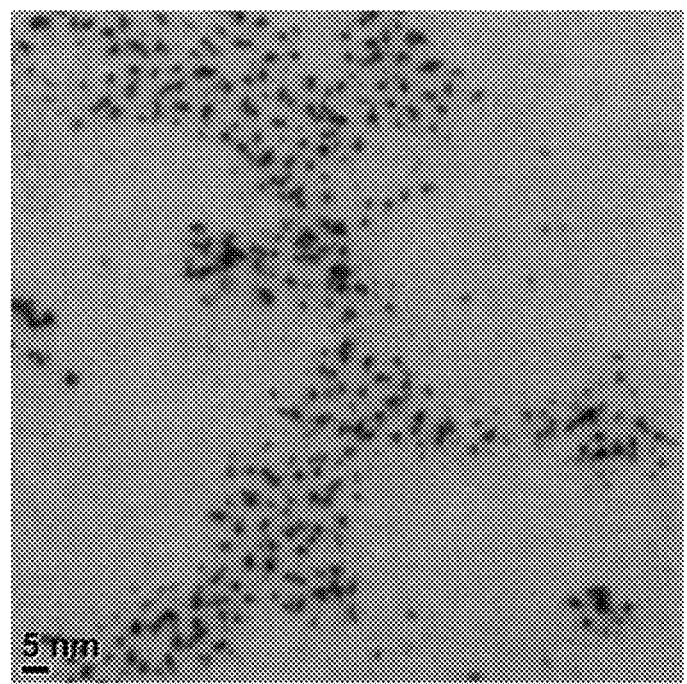
FIG. 8 is a transmission electron micrograph of nanoparticles prepared according to the disclosed process.

XRD (FIG. 2 E) of the material showed a characteristic chalcopyrite diffraction pattern, with peak positions and relative intensities intermediate between those of $CuInS_2$ and $CuGaS_2$ from the literature. The peak appear broader and less defined than those of the $CuInGaS_2$ prepared with $GaCl_3$, suggesting that the size of the particles can be tuned by using the appropriate Ga source. TEM revealed nanoparticles <3 nm diameter, as shown in FIG. 8.

Elemental analysis by ICP-OES gave the following content by weight: 13.86% Cu, 22.05% In, 2.94% Ga, 19.98% S. This corresponds to a stoichiometry of $CuIn_{0.88}Ga_{0.19}S_{2.86}$. The thiol capping agent contributes to the total sulphur content.

Example 9

Synthesis of Cu(In,Ga)S$_2$ Nanoparticles with 1-Octanethiol and Sulfur Powder

Cu(OAc) (0.369 g, 3.01 mmol), In(OAc)$_3$ (0.7711 g, 2.64 mmol), Ga(acac)$_3$ (0.4356 g, 1.19 mmol), sulfur (0.2885 g, 9.00 mmol), benzylether (15 mL) and 1-octanethiol (13.8 mL, 79.5 mmol) were loaded into a 100 mL round-bottomed flask fitted with a Liebig condenser and collector. The mixture was degassed under vacuum at 60° C. for 1 hour. After backfilling with nitrogen, the temperature was increased to 200° C. and held for 2 hours. The solution was cooled to 160° C. and annealed for 18 hours, before cooling to room temperature. The product was washed with toluene and precipitated with ethanol.

Example 10

Synthesis of Cu(In,Ga)S$_2$ Nanoparticles with 1-Octanethiol and Sulfur Powder

Cu(OAc) (0.369 g, 3.01 mmol), In(OAc)$_3$ (0.7711 g, 2.64 mmol), Ga(acac)$_3$ (0.4356 g, 1.19 mmol), sulfur (0.2885 g, 9.00 mmol) and oleylamine (9 mL) were loaded into a 100 mL round-bottomed flask fitted with a Liebig condenser and collector. The mixture was degassed under vacuum at 60° C. for 1 hour. After backfilling with nitrogen, 1-octanethiol (4.8 mL, 27.7 mmol) was injected in. The temperature was increased to 200° C. and held for 2 hours. The solution was cooled to 160° C. and annealed for 18 hours, before cooling to room temperature. The product was washed with toluene and precipitated with ethanol.

Example 11

Synthesis of CuGaS$_2$ Nanoparticles

Cu(OAc) (1.48 g, 12.1 mmol), GaCl$_3$ (6.72 g, 38.2 mmol) and ODE (20 mL) were loaded into a 100 mL round-bottomed flask and degassed at 100° C. for 1½ hours. 1-Octanethiol (18 mL, 104 mmol) was added and the temperature was raised to 200° C., then the solution was annealed for 2 hours. The temperature was reduced to 160° C. and stirred overnight, before cooling to room temperature.

The cooled reaction mixture was centrifuged at 4000 rpm for 5 minutes. The top oily layer was decanted off and discarded. The solid was dispersed in acetone, then methanol was added and the mixture was centrifuged at 4000 rpm for 5 minutes. The solid was re-dispersed in acetone/methanol and centrifuged. After discarding the supernatant, the process was repeated. The solid was rinsed twice further with acetone. The solid was dissolved in dichloromethane (DCM), then precipitated with acetone/methanol. After centrifugation at 4000 rpm for 5 minutes, the supernatant was discarded. The process was repeated, then the solid was dried under vacuum for approximately three hours. The oily solid was cleaned with two further portions of DCM/methanol, then dried overnight, leaving a dark brown oily solid as the product.

Elemental analysis by ICP-OES gave the following content by weight: 12.74% Cu, 13.42% Ga, 11.54% S. This corresponds to a stoichiometry of $CuGa_{0.96}S_{1.90}$. The thiol capping agent contributes to the total sulphur content. XRD (FIG. 2 F) showed a characteristic chalcopyrite diffraction pattern, which corresponds well to the peak positions and relative intensities of CuGaS$_2$ from the literature.

Figure 9:
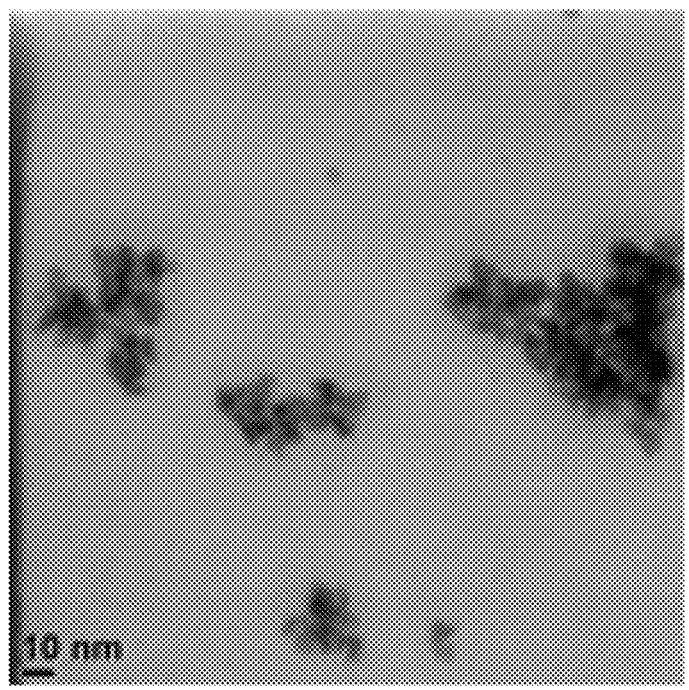
FIG. 9 is a transmission electron micrograph of nanoparticles prepared according to the disclosed process.

TEM (FIG. 9) showed aggregates of pseudo-spherical nanoparticles with average diameters of ~4-5 nm.

Example 12

Synthesis of CuInS$_2$ Nanoparticles with Tert-Nonyl Mercaptan

An oven dried 100 ml round bottom flask was charged with 5.003 g (17.1 mmol) In(OAc)$_3$, 2.005 g (16.3 mmol) Cu(OAc) and 30 ml benzylether. The flask was fitted with a Liebig condenser and collection head and heated at 100° C. for 1 hr under vacuum before being backfilled with nitrogen.

At 100° C. 9 ml (84 mmol) of butanethiol were added and the mixture was stirred for a further 30 minutes. Subsequently 13 ml (69 mmol) of tert-nonyl mercaptan were added and the mixture was heated to 140° C. and left to stir for 4 hrs before being allowed to cool to room temperature.

Upon cooling to room temperature 30 ml of propan-2-ol were added to the reaction mixture with vigorous stirring and the flask was opened to the atmosphere. The mixture was spun at 5400 G for 3 minutes and the dark supernatant was set aside. Remaining residues were twice dispersed in 10 ml toluene then 10 ml propan-2-ol added. Following each dispersal the mixture was spun at 5400 G for 3 minutes and all supernatants were combined. After two washes the remaining residues were discarded.

Methanol (300 ml) was added to the combined supernatants and the resulting precipitate was isolated by centrifugation (2700 G, 5 mins). The pale orange supernatant was discarded and the solid was re-precipitated from 10 ml dichloromethane/100 ml methanol before being isolated by centrifugation and dried under vacuum.

Figure 10:
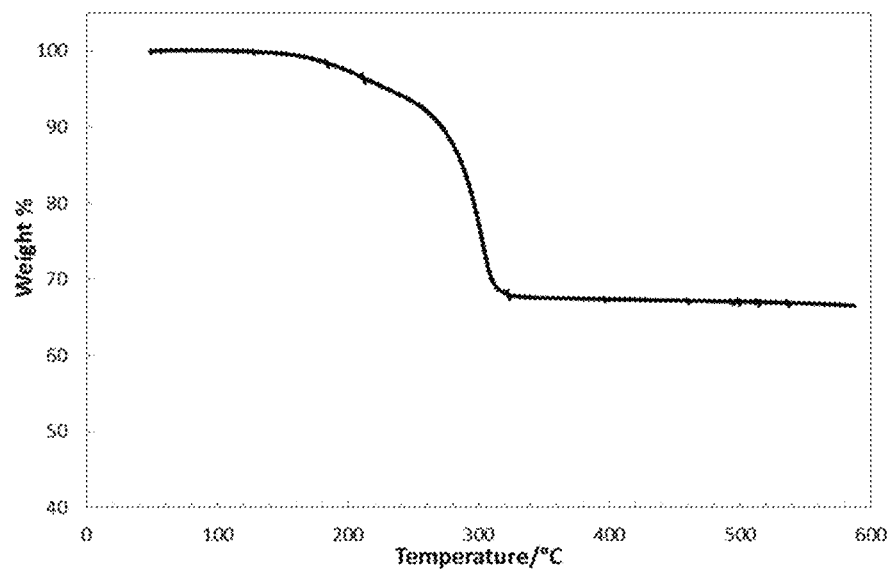
FIG. 10 is TGA analysis of CuInS$_2$ nanoparticles prepared according to an embodiment of the disclosed process.

The process yielded 4.585 g of material with inorganic content 67% by TGA (FIG. 10). The inorganic content is higher than that of $CuInS_2$ synthesised with the linear octanethiol confirming that shorter chained ligands enable a smaller carbon content in the nanoparticles.

Figure 11:
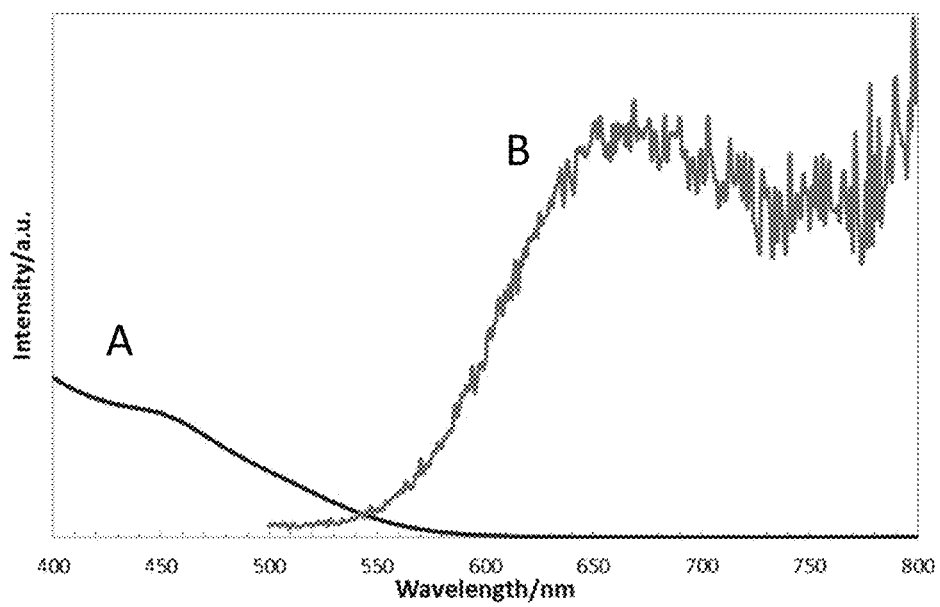
FIG. 11 is absorption and photoluminescence spectra of CuInS$_2$ nanoparticles prepared according to an embodiment of the disclosed process.

Absorption and photoluminescence spectra (FIGS. 11 A and 11 B, respectively) show quantum confinement typical of nanoparticles. The XRD pattern of the particles FIG. 2 G correlates well with the known XRD pattern of $CuInS_2$. Elemental analysis by ICP-OES gave the following content by weight: 16.40% Cu, 33.24% In, 23.41% S. This corresponds to a stoichiometry of $CuIn_{1.20}S_{2.80}$. The butanethiol capping agent contributes to the amount of S.

Example 13

Synthesis of $Cu(In,Ga)S_2$ Nanoparticles with Tert-Nonyl Mercaptan

An oven dried 250 ml round bottom flask was charged with 3.529 g (12.1 mmol) $In(OAc)_3$, 1.901 g (5.2 mmol) $Ga(acac)_3$, 3.227 g (16.2 mmol) $Cu(OAc)_2 \cdot H_2O$, 22.5 ml oleylamine and 30 ml benzylether. The flask was fitted with a Liebig condenser and collection head and the mixture was heated at 100° C. under vacuum for 1 hr before being backfilled with nitrogen.

Degassed 1-octanethiol (12 ml, 69 mmol) were added at 100° C. and the mixture left to stir for 15 minutes then 13 ml (69 mmol) of degassed tert-nonyl mercaptan were added. The mixture was heated to 160° C. for 4.5 hrs before being allowed to cool to room temperature.

Upon cooling, the flask was opened to the atmosphere then 50 ml propan-2-ol were added. The mixture was spun at 2700 G for 5 minutes and the dark red supernatant set aside. Remaining residues were dispersed in 20 ml toluene, upon which 40 ml propan-2-ol was added. The dispersal was spun at 2700 G for 5 minutes and the supernatant combined with the previous supernatants. Remaining residue was discarded.

Methanol (250 ml) was added to the combined supernatants and the mixture spun at 2700G for 5 minutes. The pale orange supernatant was discarded and the resulting solid was dispersed in 30 ml of toluene. Propan-2-ol (45 ml) were added and the mixture spun at 2700 G for 5 minutes. The supernatant was set aside and residues left behind were discarded. Methanol (150 ml) was added to the supernatant and the resulting flocculated solid was isolated by centrifugation (2700 G, 5 minutes) and then re-precipitated from dichloromethane (30 ml)/acetone (60 ml)/methanol (180 ml) then from dichloromethane (30 ml)/methanol (150 ml). The precipitate was isolated by centrifugation and dried under vacuum.

Figure 12:
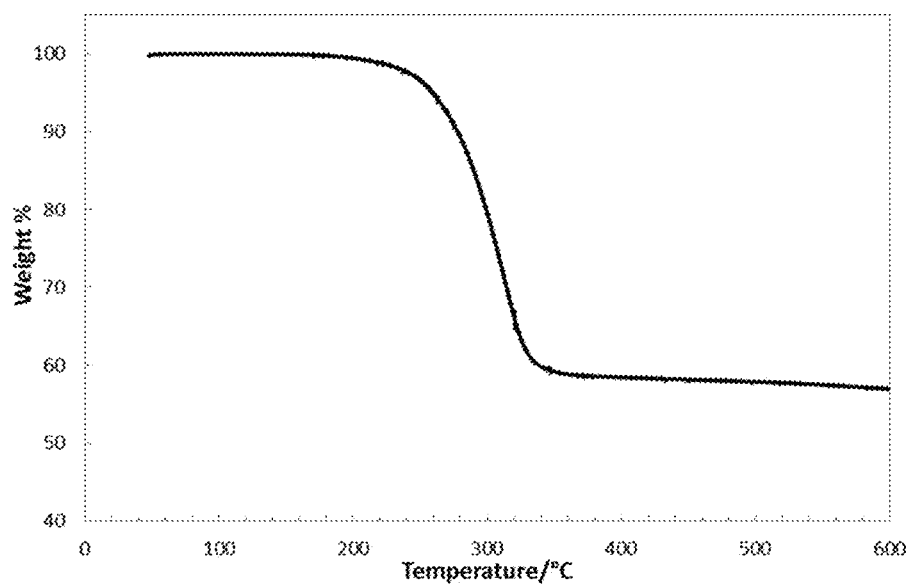
FIG. 12 is TGA analysis of Cu(In,Ga)S$_2$ nanoparticles prepared according to an embodiment of the disclosed process.
Figure 13:
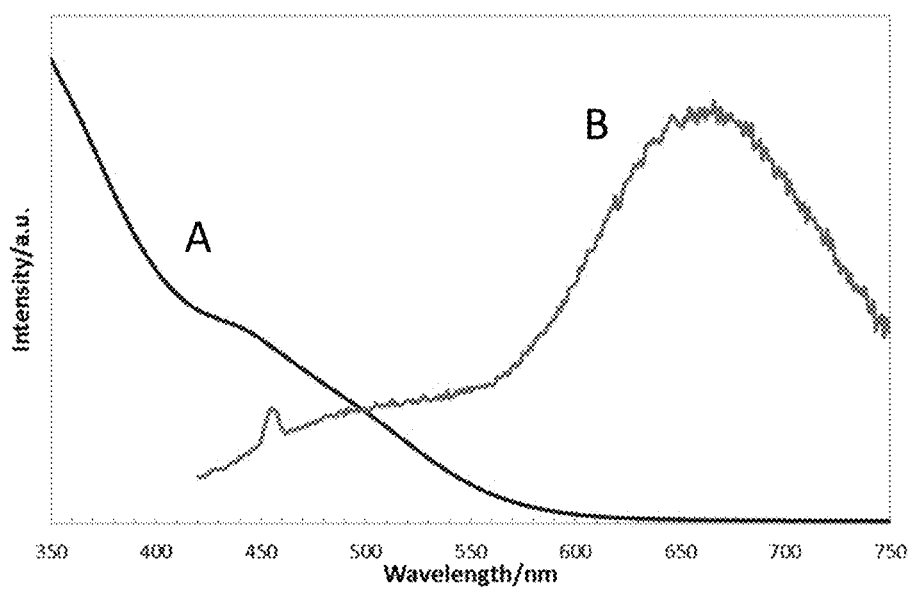
FIG. 13 is absorption and photoluminescence spectra of Cu(In,Ga)S$_2$ nanoparticles prepared according to an embodiment of the disclosed process.

The process yielded 5.962 g of material with inorganic content 57% by TGA (FIG. 12). Absorption and photoluminescence spectra (FIGS. 13 A and 13 B, respectively) show quantum confinement typical of nanoparticles. Elemental analysis by ICP-OES gave the following content by weight: 13.93% Cu, 20.42% In, 4.74% Ga, 15.97% S. This corresponds to a stoichiometry of $CuIn_{0.81}Ga_{0.31}S_{2.80}$.

It should be noted that oleyamine, the solvent used in this example, boils at a higher temperature (~350° C.) than the solvents used in the previous examples. However, TGA (FIG. 12) of the nanoparticles prepared according to the process described in this example shows that all organics associated with the nanoparticles evaporate at temperatures less than 350° C., indicating that oleyamine does not cap the nanoparticles. Thus, oleyamine is not incorporated into films prepared using nanoparticles prepared according to this process and does not contribute to residual carbon in the films.

Although particular embodiments of the present invention have been shown and described, they are not intended to limit what this patent covers. One skilled in the art will understand that that various changes and modifications may be made without departing from the scope an invention supported by the present disclosure.

We claim:

1. A composition comprising a population of nanoparticles having the empirical formula $CuIn_xGa_{1-x}S_2$ wherein (0<x<1), wherein each nanoparticle comprises an organic ligand layer bound to the surface of the nanoparticle, and wherein the organic ligand layer consists essentially of thiols and the thiols have a boiling point of less than 100° C.

2. A composition according to claim 1, wherein the thiols comprise ten or fewer carbon atoms.

3. A composition according to claim 1, wherein the thiols comprise eight or fewer carbon atoms.

4. A composition according to claim 1, wherein the thiols comprise six or fewer carbon atoms.

5. A composition according to claim 1, wherein the thiols are ejected from the nanoparticles when the nanoparticles are heated to a temperature below 300° C.

6. A composition according claim 1, wherein the population exhibits an emission spectrum having a full width at half maximum (FWHM) of less than about 200 nm.

7. A composition according claim 1, wherein the population exhibits an emission spectrum having a full width at half maximum (FWHM) of less than about 100 nm.

8. A process for preparing nanoparticles, comprising: mixing a copper salt, an indium salt, a gallium salt, and a thiol in an organic solvent and heating the solvent to a temperature of not greater than 150° C.

9. A process according to claim 8, further comprising adding a solution of tri-n-octylphosphine sulfide (TOP:S) to the solvent.

10. A process according to claim 8, wherein the thiol has a boiling point of less than 150° C.

11. A process according to claim 8, wherein the thiol has a boiling point of less than 100° C.

12. A process according to claim 8, wherein the thiol comprises ten or fewer carbon atoms.

13. A process according to claim 8, wherein the thiol comprises eight or fewer carbon atoms.

14. A process according to claim 8, wherein the thiol comprises six or fewer carbon atoms.

15. A process for preparing nanoparticles, comprising: mixing a copper salt, an indium salt, a gallium salt, and a thiol having a boiling point of less than 150° C. in an organic solvent and heating the solvent to a temperature of not greater than 220° C.

16. A process for preparing nanoparticles, comprising: mixing a copper salt, an indium salt, a gallium salt, and a thiol having a boiling point of less than 100° C. in an organic solvent and heating the solvent to a temperature of not greater than 220° C.

* * * * *